(12) United States Patent
Foong et al.

(10) Patent No.: US 9,053,972 B1
(45) Date of Patent: Jun. 9, 2015

(54) PILLAR BUMP FORMED USING SPOT-LASER

(71) Applicants: Chee Seng Foong, Sg. Buloh (MY); Lan Chu Tan, Singapore (SG)

(72) Inventors: Chee Seng Foong, Sg. Buloh (MY); Lan Chu Tan, Singapore (SG)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/086,932

(22) Filed: Nov. 21, 2013

(51) Int. Cl.
*H01L 21/48* (2006.01)
*H01L 23/498* (2006.01)
*H01L 23/00* (2006.01)

(52) U.S. Cl.
CPC .............. *H01L 24/11* (2013.01); *H01L 24/13* (2013.01)

(58) Field of Classification Search
CPC ............... B22F 3/10; B22F 7/02; B22F 7/06; B22F 9/00; H01L 2924/01013; H01L 2924/01018; H01L 2924/0033; H01L 2924/01046; H01L 2924/01078; H01L 2924/01079; H01L 23/49811; H01L 24/11; H01L 24/13; H01L 24/81; B23K 26/22; B23K 1/005; B23K 1/0053; B23K 1/0056; B23K 2201/40; B23K 2203/043; B23K 2203/0557
USPC ......... 438/613, 463, 460, 758, 762, 114, 115; 257/737, 738, 778, E21.517, E21.506, 257/E23.079; 419/8, 23, 52; 228/48.1, 178, 228/189, 226.1, 19, 180.22; 219/121.63
See application file for complete search history.

(56) References Cited

U.S. PATENT DOCUMENTS

| | | | |
|---|---|---|---|
| 4,855,102 A | 8/1989 | Okada | |
| 6,173,887 B1 | 1/2001 | Mead | |
| 6,676,892 B2 | 1/2004 | Das | |
| 7,205,230 B2 | 4/2007 | Mashino | |
| 7,208,824 B2 | 4/2007 | Lee | |
| 8,193,072 B2 * | 6/2012 | Li et al. | 438/462 |
| 2002/0138979 A1 * | 10/2002 | Matsuda | 29/853 |
| 2008/0048009 A1 * | 2/2008 | Maeda et al. | 228/208 |
| 2012/0280388 A1 | 11/2012 | Wu | |
| 2012/0306080 A1 | 12/2012 | Yu | |
| 2014/0124928 A1 * | 5/2014 | Lin et al. | 257/738 |
| 2014/0268780 A1 * | 9/2014 | Wang et al. | 362/249.06 |

OTHER PUBLICATIONS

J.A. Manriquez-Frayre and D.L. Bourell, Selective Laser Sintering of Binary Metallic Powder, U.Texas-Austin, 1990.

* cited by examiner

*Primary Examiner* — Alexander Oscar Williams
(74) *Attorney, Agent, or Firm* — Charles Bergere

(57) ABSTRACT

A pillar bump, such as a copper pillar bump, is formed on an integrated circuit chip by applying a metallic powder over a conductive pad on a surface of the chip. The metallic powder is selectively spot-lasered to form the pillar bump. Any remaining unsolidified metallic powder may be removed from the surface of the chip. This process may be repeated to increase the bump height. Further, a solder cap may be formed on an outer surface of the pillar bump.

9 Claims, 2 Drawing Sheets

PILLAR BUMP FORMED USING SPOT-LASER

BACKGROUND OF THE INVENTION

The present invention relates generally to surface mount technologies, and, more particularly to the formation of electrically conductive bumps used in surface mount technologies (SMTs).

Flip-chip bumps are used to interconnect semiconductor devices, such as integrated circuit (IC) chips and microelectromechanical system (MEMS) devices, to an external substrate (e.g., a circuit board or another chip or wafer). Conventional bumps have been formed entirely of metal solder or another metal, such as copper, that is plated with solder, and are formed on the chip pads on the active side of the dies on the wafer during the final wafer processing steps.

When mounting the chip to external circuitry, the chip is turned or flipped over so that its active side faces down, and aligned so that its bumps align with matching pads on the external circuitry. The solder on the bumps is then flowed, through a process known as controlled collapse chip connection (C4), to form both a mechanical connection and an electrical connection with the external circuitry.

In implementations that utilize copper (or another metal), the copper acts as a pillar that provides a fixed stand-off between the chip and the external circuitry. To form the pillar, a layer of photoresist is spin coated over the entire wafer and cured, and, in a subsequent process, cylindrical channels are formed in the photoresist above the chip pads by photolithography and etching.

The channel acts as a mold that is filled with copper using electroplating to form the copper pillar. The channel also acts as a mold to electroplate a solder cap onto the top of the copper pillar. The remaining photoresist is then removed by etching to expose the copper pillar bump. During mounting, the solder cap is heated to its melting temperature, although not to the melting temperature of the copper pillar. It would be advantageous to have a more economical method of forming these electrically conductive bumps.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment of the present invention, a pillar bump is formed on a chip by applying a metallic powder over a conductive pad on a surface of the chip. The metallic powder is selectively spot-lasered to form a solid metallic element, and any remaining unsolidified metallic powder is removed from the surface of the chip. A solid solder cap is then formed on an outer surface of the metallic element to form the pillar bump.

In another embodiment, an apparatus for forming a pillar bump comprising the pillar bump formed on the chip by the method described above is provided.

In yet another embodiment, the present invention is a chip comprising a pillar bump, wherein the pillar bump comprises a solid metallic element having a partial spheroid-like shape and a solder cap formed on an outer surface of the metallic element.

Figure 1:
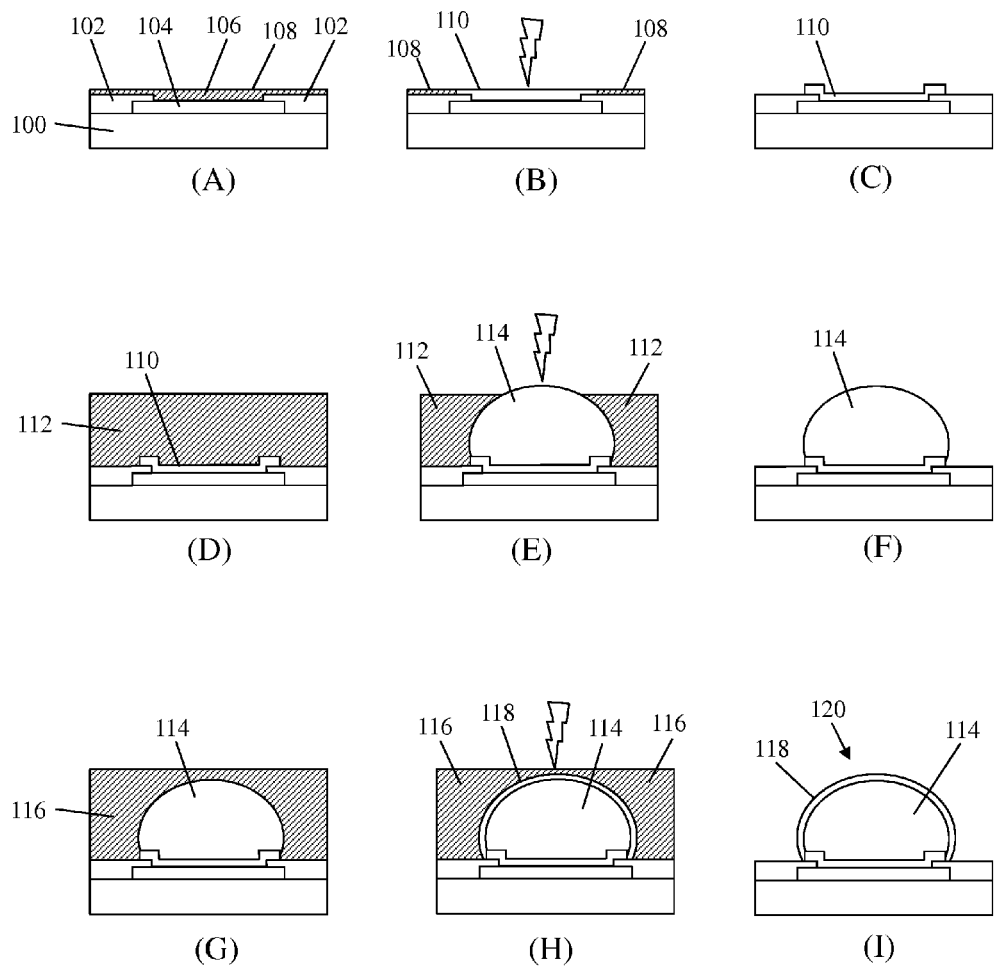
FIG. 1 shows cross-sectional side views that illustrate steps of an exemplary method of fabricating an electrically conductive bump according to one embodiment of the present invention.

Referring now to FIG. 1, cross-sectional side views that illustrate steps of an exemplary method of fabricating an electrically conductive pillar bump on a conductive pad of an integrated circuit according to one embodiment of the present invention are shown.

FIG. 1 shows an integrated circuit (IC) or chip 100 having a passivation layer 102 and a conductive pad 104 formed on the passivation layer 102. The passivation layer 102, which may be fabricated using glass, silicon nitrate, or any other suitable material and using any suitable passivation process, has a gap 106 formed therein, which exposes at least a portion of the conductive pad 104 to the ambient environment above the IC 100. The conductive pad 104 may be fabricated using copper, aluminum-gold, or any other suitable conductive material and any suitable fabrication process. Fabrication of passivation layers and conductive pads are well known and therefore are not described herein.

Although not shown, it will be understood that the IC 100 may comprise a one- or two-dimensional array of conductive pads similar to the conductive pad 104, and that the method shown in FIG. 1 of fabricating a pillar bump on the conductive pad 104 may be used to fabricate pillar bumps on the other conductive pads in the array.

In FIGS. 1(A)-(C), which correspond to steps (A)-(C), an under-bump metallization (UBM) layer 110 is formed on top of the conductive pad 104 and a portion of the passivation layer 102 immediately adjacent to the gap 106 that exposes the conductive pad 104. In particular, in step (A), a UBM powder 108 is applied (e.g., poured) across the top of the IC 100 to cover the exposed portion of the conductive pad 104 and at least a part of the passivation layer 102. The UBM powder 108 may be leveled by rolling a roller (not shown)

across the UBM powder 108. The UBM layer 110 acts as a diffusion barrier that enables a pillar bump 120 to be formed on the conductive pad 104.

In step (B), the UBM powder 108 is selectively spot-lasered to solidify the UBM layer 110 and form a three-dimensional structure. The selective spot-lasering may be performed using, for example, selective-laser sintering (SLS) or selective-laser melting (SLM) with a carbon dioxide (CO2) beam or an yttrium aluminium garnet (YAG) beam. Although not shown, the application of powder and selective spot-lasering may be repeated one or more times after step B to build up the UBM layer 110 to have the shape shown in step (C) or another desired shape. Further, with each application of powder, a different metal or metal alloy powder may be employed such that the UBM layer 110 forms a stack of thin layers of different materials (e.g., TiWCu, TiCu, TiNiCu). After spot-lasering, any excess UBM powder 108 is removed in step (C) using, for example, vacuuming or another suitable technique.

FIG. 1(D)-(F) correspond to steps (D)-(F). In particular, in step (D), a metallic powder 112 is applied (e.g., poured) across the top of the integrated circuit 100. The metallic powder 112 may be leveled by rolling a roller (not shown) across the metallic powder 112. The metallic powder 112 used in step (D) may comprise a pure metal or a metal alloy such as (without limitation) pure copper, a copper alloy, a nickel alloy, a titanium alloy, or a cobalt chrome alloy. It is preferred that the metallic powder 112 has a melting temperature suitable for melting or sintering, and that is higher than that of solder. Further, the metallic powder 112 should have electrical, mechanical, and thermal properties suitable for surface mounting.

In step (E), the metallic powder 112 is selectively spot-lasered using a suitable technique such as SLS or SLM as discussed above, to form a solid, three-dimensional metallic element 114. In FIG. 1, the metallic element 114 has a partial spheroid-like shape; however, the size and shape of the metallic element 114 may be controlled by adjusting, for example, (i) the height of the metallic powder 112, (ii) the characteristics of the laser, and (iii) the area over which the laser is focused. Note that, as used herein, the term "spheroid" refers to a set of shapes comprising spheres, oblate spheroids, and prolate spheroids. In step (F), the excess metallic powder 112 is removed using, for example, vacuuming or another suitable technique.

FIG. 1(G)-(H) corresponds to steps (G)-(H). In particular, in step (G), a solder powder 116 is applied (e.g., poured) across the top of the IC 100 such that the metallic element 114 is completely covered. The solder powder 116 may be leveled by rolling a roller (not shown) across the solder powder 116.

In step (H), a solid, three-dimensional solder cap 118 is formed on the outer surface of the metallic element 114 using a suitable selective spot-lasering technique such as SLS or SLM as discussed above. For example, the spot laser may be applied to the metallic element 114 such that (i) the outer surface of the metallic element 114 heats up, and (ii) the heat from the outer surface of the metallic element 114 melts a relatively thin layer of the solder powder 116 onto the outer surface of the metallic element 114, without melting the metallic element 114. The excess solder powder 116 is then removed in step (I) using, for example, vacuuming or another suitable technique, to expose the resulting pillar bump 120 to the ambient environment.

Figure 2:
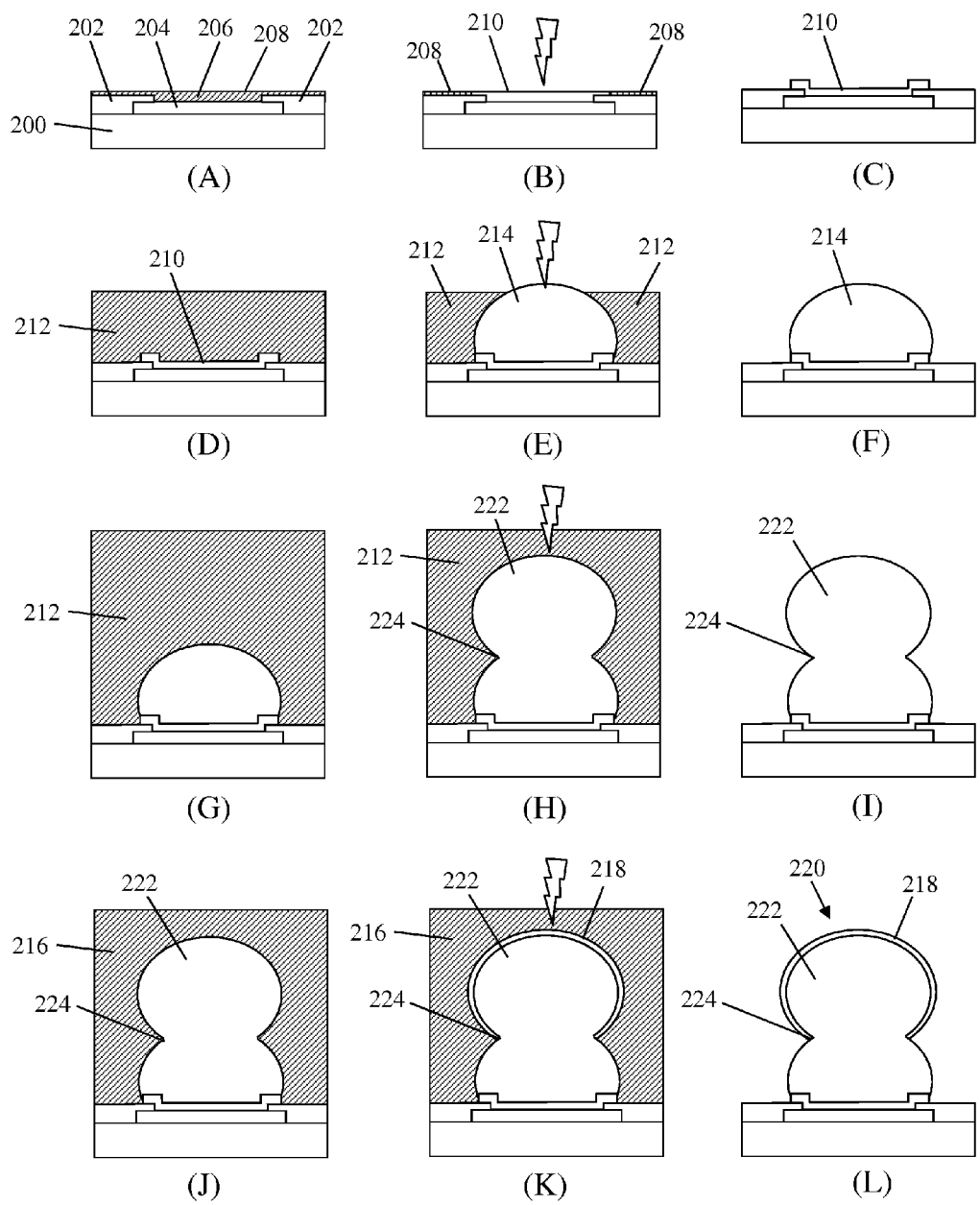
FIG. 2 shows cross-sectional side views that illustrate steps of an exemplary method of fabricating electrically conductive bumps according to another embodiment of the present invention.

FIG. 2 shows cross-sectional side views that illustrate steps of an exemplary method of fabricating a pillar bump 220 according to another embodiment of the present invention. In this embodiment, the features 200-214 are analogous to the features 100-114 in FIG. 1, respectively.

Integrated circuit 200 may comprise a one- or two-dimensional array of conductive pads 204 similar to the IC 100 as described above, and the method shown in FIG. 2 may be used to fabricate pillar bumps 220 on the one, some or all of the conductive pads 204 in the array. In FIG. 2, steps (A)-(F) are similar to steps (A)-(F) in FIG. 1. Note, however, that the removal of excess metallic powder 212 in step (F) may be omitted since additional metallic powder is added in step (G).

In steps (G)-(I), a second metallic element 222 having a partial spheroid-like shape is formed on top of the first metallic element 214 resulting in a metallic structure 224 having a height that is greater than that of the metallic element 114 of FIG. 1. In particular, in step (G), the metallic powder 212 is applied (e.g., poured) across the top of the integrated circuit 200 and over the metallic element 214. The metallic powder 212 may be leveled by rolling a roller (not shown) across the metallic powder 212.

In step (H), the metallic powder 212 is selectively spot-lasered using a suitable technique such as SLS or SLM as discussed above, to form a second solid, three-dimensional metallic element 222 on top of the first metallic element 214. The excess metallic powder 212 is then removed in step (I) using, for example, vacuuming or another suitable technique.

In steps (J)-(L), a solder cap 218 is formed on top of the outer surface of the second metallic element 222. In particular, in step (J), solder powder 216 is applied, such as by pouring, across the top of the IC 200 such that the metallic structure 224 is completely covered. The solder powder 216 may be leveled by rolling a roller (not shown) across the solder powder 216.

In step (K), a solid, three-dimensional solder cap 218 is formed on the outer surface of the second metallic element 222 using a suitable selective spot-lasering technique in a manner similar to that described above in relation to step (H) of FIG. 1. The excess solder powder 216 is then removed in step (L) using, for example, vacuuming or another suitable technique, to expose the resulting pillar bump 220 to the ambient environment.

The embodiments of shown in FIGS. 1 and 2 are completely dry processes (i.e., no wet materials are used). The excess UBM powders 108 and 208, the excess metallic powders 112 and 212, and the excess solder powders 116 and 216 that are not solidified during the lasering steps may be reused such that little, if any, of these powders are wasted.

The use of spot lasering on the various powders eliminates the need to form a cylindrical channel (i.e., mold) over the pads 104 and 204 of the ICs 100 and 200 using solder resist, photolithography, and etching. Thus, the processes in FIGS. 1 and 2 are completely mask-less. This eliminates wasted solder resist, simplifies the manufacturing process, and reduces manufacturing times and costs.

Further, the use of spot lasering on the metallic powders 112 and 212 (e.g., in steps (E) and (H)) enables metallic elements to be formed at 100% density (i.e., without voids).

Yet further, the use of spot lasering on the various powders enables pillar heights to be increased, pillar diameters to be decreased, and pillar pitches to be decreased compared to conventional methods that use photolithography. As a result, the methods shown in FIGS. 1 and 2 may enable the formation of taller, thinner, and more densely packed pillar bumps than conventional pillar bump formation methods.

The steps performed in FIGS. 1 and 2 may be performed in low-temperature environments, thereby eliminating any adverse effects that high-temperature processes might have on the fabrication of the chip. For example, high-temperature processes could result in "trapping" residue stresses in the materials due to a coefficient of thermal expansion (CTE) mismatch at the high temperatures and oxidation of exposed metals. Further, high-temperature processes may limit the materials that are suitable for chip fabrication.

According to alternative embodiments of the present invention, the height of the pillar bump may be further increased before forming the solder cap by repeating the steps of (i) laying the metallic powder and (ii) lasering the metallic powder to form additional metallic elements on top of the preceding elements.

Although FIGS. 1 and 2 show two embodiments in which the UBM layers 110 and 210 are formed using a laser, embodiments of the present invention are not so limited. According to alternative embodiments of the present invention, the UBM layer may be formed using another suitable technique. For example, the UBM layer may be formed using sputtering, wherein ions of an inert gas are used to dislodge atoms from the surface of a crystalline material. The atoms are then electrically deposited to form an extremely thin coating on surfaces such as glass, metal, plastic, or other surfaces.

Further, although FIGS. 1 and 2 show embodiments in which the solder caps 118 and 218 are formed using a laser, in alternative embodiments, the solder cap may be formed using another suitable technique, for example, using a plating technique. Yet further, although the solder cap 218 in FIG. 2 is formed only on the outer surface of the second metallic element 222, the solder cap may be formed on two or more stacked metallic elements.

By now it should be appreciated that there has been provided an improved pillar bump and a method of forming the improved pillar bump.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the present invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the term "mounted on" covers situations in which a first element is mounted directly on a second element with no other intervening elements, as well as situations in which there are two or more intervening elements between the first element and the second element.

Although the present invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A method for forming an electrically conductive pillar bump on a conductive pad of an integrated circuit chip, the method comprising:
   (a) applying a metallic powder over an active surface of the chip and the conductive pad;
   (b) selectively applying a spot-laser to the metallic powder to form at least one solid metallic element;
   (c) removing un-solidified metallic powder from the surface of the chip; and
   (d) forming a solder cap on an outer surface of the at least one solid metallic element to thereby form the pillar bump.

2. The method of claim 1, wherein:
   the method further comprises forming, before step (a), a solid under-bump metallization (UBM) layer over the conductive pad;
   in step (a), the metallic powder is applied over the UBM layer; and
   in step (b), the at least one solid metallic element is formed on the UBM layer.

3. The method of claim 2, wherein forming the UBM layer comprises:
   applying a UBM powder over a surface of the chip such that the UBM powder covers the conductive pad;
   forming the solid UBM layer by at least one of melting and sintering the UBM powder; and
   removing un-solidified UBM powder from the surface of the chip.

4. The method of claim 2, wherein step (d) comprises:
   applying a solder powder over a surface of the chip such that the solder powder covers the at least one solid metallic element;

forming the solder cap on the outer surface of the at least one solid metallic element by at least one of melting and sintering the solder powder; and removing un-solidified solder powder from the surface of the chip.

5. The method of claim 1, wherein step (d) comprises:

applying a solder powder over a surface of the chip such that the solder powder covers the at least one solid metallic element;

forming the solid solder cap on the outer surface of the at least one solid metallic element by at least one of melting or sintering the solder powder; and removing un-solidified solder powder from the surface of the chip.

6. The method of claim 1, wherein step (d) comprises plating a solder cap onto the outer surface of the at least one solid metallic element.

7. The method of claim 1, wherein step (b) further comprises:

applying the metallic powder over the surface of the chip and the at least one solid metallic element;

selectively applying a spot-laser to the metallic powder to form at least one other solid metallic element on the at least one solid metallic element.

8. The method of claim 1, wherein step (b) comprises performing at least one of selective-laser sintering (SLS) and selective-laser melting (SLM).

9. A pillar bump formed in accordance with the method recited in claim 1.

* * * * *